United States Patent
Ishii et al.

(10) Patent No.: US 9,642,262 B2
(45) Date of Patent: May 2, 2017

(54) METHOD OF MANUFACTURING A PRINTED CIRCUIT BOARD ASSEMBLY SHEET

(71) Applicant: Nitto Denko Corporation, Ibaraki-shi, Osaka (JP)

(72) Inventors: Jun Ishii, Ibaraki (JP); Terukazu Ihara, Ibaraki (JP); Naohiro Terada, Ibaraki (JP)

(73) Assignee: NITTO DENKO CORPORATION, Ibaraki-shi, Osaka (JP)

( * ) Notice: Subject to any disclaimer, the term of this patent is extended or adjusted under 35 U.S.C. 154(b) by 312 days.

(21) Appl. No.: 14/141,705

(22) Filed: Dec. 27, 2013

(65) Prior Publication Data

US 2014/0101934 A1  Apr. 17, 2014

Related U.S. Application Data

(62) Division of application No. 13/189,612, filed on Jul. 25, 2011, now Pat. No. 8,658,906.
(Continued)

(30) Foreign Application Priority Data

Aug. 6, 2010 (JP) .................................. 2010-177632

(51) Int. Cl.
H05K 3/02 (2006.01)
H05K 3/10 (2006.01)
(Continued)

(52) U.S. Cl.
CPC ......... *H05K 3/4644* (2013.01); *H05K 3/0097* (2013.01); *G11B 5/486* (2013.01);
(Continued)

(58) Field of Classification Search
CPC .. H01L 2924/3511; H05K 2201/09781; H05K 1/0271; Y10T 29/49124; Y10T 29/49155; Y10T 29/49117
(Continued)

(56) References Cited

U.S. PATENT DOCUMENTS 6,157,072 A * 12/2000 Nakayama ........ H01L 27/14601
257/443
7,307,853 B2  12/2007 Funada et al.
(Continued)

FOREIGN PATENT DOCUMENTS

CN  1444435 A  9/2003
CN  1826034 A  8/2006
(Continued)

OTHER PUBLICATIONS

Office Action issued Apr. 15, 2015 in CN Application No. 201110225013.5.
(Continued)

*Primary Examiner* — Thiem Phan
(74) *Attorney, Agent, or Firm* — Panitch Schwarze Belisario & Nadel LLP

(57) ABSTRACT

A dummy trace portion is provided in a region between at least a suspension board with circuit on one end side and a support frame of a suspension board assembly sheet with circuits. A base insulating layer is formed on a support substrate in the dummy trace portion. A plurality of conductor traces are formed on the base insulating layer, and a cover insulating layer is formed on the base insulating layer to cover each conductor trace. At least one of the base insulating layer and the cover insulating layer in the dummy trace portion has a groove.

12 Claims, 10 Drawing Sheets

Related U.S. Application Data

(60) Provisional application No. 61/378,091, filed on Aug. 30, 2010.

(51) Int. Cl.
*H05K 3/46* (2006.01)
*H05K 1/02* (2006.01)
*H05K 3/00* (2006.01)
*G11B 5/48* (2006.01)

(52) U.S. Cl.
CPC ......... *H05K 1/0271* (2013.01); *H05K 3/0052* (2013.01); *H05K 2201/09781* (2013.01); *Y10T 29/49124* (2015.01)

(58) Field of Classification Search
USPC .............. 29/846, 825, 829, 830, 831, 847; 174/254, 255, 257, 268; 257/443, 448, 257/457, E27.133
See application file for complete search history.

(56) References Cited

U.S. PATENT DOCUMENTS

| | | |
|---|---|---|
| 8,222,530 B2 | 7/2012 | Ishigaki |
| 8,334,462 B2 | 12/2012 | Kamei |
| 2003/0172526 A1 | 9/2003 | Komatsubara et al. |
| 2006/0169486 A1 | 8/2006 | Funada et al. |
| 2010/0155113 A1 | 6/2010 | Kamei |
| 2010/0175913 A1 | 7/2010 | Ishigaki |
| 2012/0033395 A1 | 2/2012 | Ishii et al. |

FOREIGN PATENT DOCUMENTS

| | | |
|---|---|---|
| CN | 101754575 A | 6/2010 |
| CN | 101778529 A | 7/2010 |
| JP | H10-321972 A | 12/1998 |
| JP | 2001-101637 A | 4/2001 |
| JP | 2003-086732 A | 3/2003 |
| JP | 2003-258158 A | 9/2003 |
| JP | 2003-273498 A | 9/2003 |
| JP | 2006-059849 A | 3/2006 |
| JP | 2007-109725 A | 4/2007 |
| JP | 2007-115828 A | 5/2007 |
| JP | 4108784 B2 | 6/2008 |

OTHER PUBLICATIONS

Office Action issued Aug. 27, 2013 in JP Application No. 2010-177632.
Office Action issued May 30, 2013 in U.S. Appl. No. 13/189,612 by Ishii.
Office Action issued Dec. 2, 2014 in CN Application No. 201110225013.5.
Notice of Allowance issued Feb. 18, 2014 in JP Application No. 2010-177632.

* cited by examiner

METHOD OF MANUFACTURING A PRINTED CIRCUIT BOARD ASSEMBLY SHEET

CROSS-REFERENCE TO RELATED APPLICATIONS

This application is a Divisional of U.S. patent application Ser. No. 13/189,612, filed Jul. 25, 2011, which claims the benefit of U.S. Provisional Patent Application No. 61/378,091, filed Aug. 30, 2010, and the disclosures of which are incorporated herein by reference.

BACKGROUND OF THE INVENTION

Field of the Invention

The present invention relates to a printed circuit board assembly sheet and a method of manufacturing the same.

Description of the Background Art

Actuators are employed in drives such as hard disk drives. Such an actuator includes an arm arranged rotatably with respect to a rotation shaft and a suspension board with circuit for a magnetic head that is attached to the arm. The suspension board with the circuit is a printed circuit board for positioning the magnetic head with a desired track of a magnetic disk.

In manufacturing steps of such a suspension board with circuit, a plurality of assembly sheets each including suspension boards with circuits (hereinafter referred to as suspension board assembly sheets with circuits) are formed on a metal support substrate. The support substrate is then cut, so that the suspension board assembly sheets with circuits are separated from one another. A plurality of suspension boards with circuits are arranged in alignment within a rectangular support frame in the suspension board assembly sheet with circuits (see JP 2007-109725 A and JP 2007-115828 A, for example). Finally, each of the suspension boards with circuits is separated from the suspension board assembly sheet with circuits.

Preparing the suspension board assembly sheet with circuits makes it easy to handle the plurality of suspension boards with circuits. However, each of the suspension board assembly sheets with circuits cut and separated from the support substrate may be warped. Thus, each of the suspension boards with circuits that are to be separated from the suspension board assembly sheet with circuits may also be warped in the final manufacturing step.

BRIEF SUMMARY OF THE INVENTION

An object of the present invention is to provide a printed circuit board assembly sheet that is inhibited from being warped and a method of manufacturing the same.

(1) According to one aspect of the present invention, a printed circuit board assembly sheet includes a plurality of printed circuit boards, a support frame configured to integrally support the plurality of printed circuit boards such that the plurality of printed circuit boards are arranged at spacings, and a dummy trace portion provided in a region between at least a printed circuit board on one end side and the support frame, wherein each of the plurality of printed circuit boards and the dummy trace portion includes a support substrate, a first insulating layer formed on the support substrate, a plurality of conductor traces formed on the first insulating layer, and a second insulating layer formed on the first insulating layer to cover the plurality of conductor traces, and at least one of the first and second insulating layers in the dummy trace portion has a groove.

In the printed circuit board assembly sheet, the at least one of the first and second insulating layers in the dummy trace portion has the groove. This reduces residual stress in the at least one of the first and second insulating layers in the dummy trace portion. As a result, the printed circuit board assembly sheet is inhibited from being warped.

(2) The groove may be formed in the second insulating layer in a region between adjacent conductor traces in the dummy trace portion.

In this case, the thickness of the region between the conductor traces is smaller than the thickness of other portions. This sufficiently reduces residual stress in the region between the conductor traces. As a result, the printed circuit board assembly sheet is sufficiently inhibited from being warped.

(3) The groove may be formed in the first insulating layer in a region between adjacent conductor traces in the dummy trace portion.

In this case, the thickness of the region between the conductor traces is smaller than the thickness of other portions. This sufficiently reduces residual stress in the region between the conductor traces. As a result, the printed circuit board assembly sheet is sufficiently inhibited from being warped.

(4) An opening may be further formed in the support substrate in the dummy trace portion. In this case, residual stress is also reduced in the opening of the support substrate in the dummy trace portion. This sufficiently inhibits the printed circuit board assembly sheet from being warped.

(5) The support frame may have a pair of first frame portions that are substantially parallel to each other, and a pair of second frame portions that are substantially perpendicular to the first frame portions, and the plurality of printed circuit boards are provided to be arranged in a direction parallel to the pair of first frame portions, and the dummy trace portion may be provided in a region between at least the printed circuit board on the one end side and one of the pair of second frame portions, and the conductor traces and the groove in the dummy trace portion may be formed to extend in a direction from one of the first frame portions to the other one of the first frame portions.

In this case, the residual stress in the direction from the one of the first frame portions toward the other one of the first frame portions in the dummy trace portion is reduced. This inhibits the pair of second frame portions from being warped.

(6) The printed circuit board may be a suspension board with circuit. In this case, the printed circuit board assembly sheet including the plurality of suspension boards with circuits is inhibited from being warped. Thus, flatness is ensured in the plurality of suspension boards with circuits. This improves the manufacture yield of the plurality of suspension boards with circuits.

(7) According to another aspect of the present invention, a method of manufacturing a printed circuit board assembly sheet that includes a plurality of printed circuit boards, a support frame configured to integrally support the plurality of printed circuit boards such that the plurality of printed circuit boards are arranged at spacings, and a dummy trace portion provided in a region between at least a printed circuit board on one end side and the support frame includes the steps of forming first insulating layers, which correspond to the plurality of printed circuit boards and the dummy trace portion, on a support substrate, forming a plurality of conductor traces on each of the first insulating layers corresponding to the plurality of printed circuit boards and the first insulating layer corresponding to the dummy trace portion, and forming second insulating layers on the first insulating layers to cover the plurality of conductor traces corresponding to the plurality of printed circuit boards and the conductor trace corresponding to the dummy trace portion, respectively, wherein at least one of the first and second insulating layers in the dummy trace portion has a groove.

In the method of manufacturing the printed circuit board assembly sheet, the at least one of the first and second insulating layers in the dummy trace portion has the groove. This reduces residual stress in the at least one of the first and second insulating layers in the dummy trace portion. As a result, the printed circuit board assembly sheet is inhibited from being warped.

(8) The step of forming the second insulating layer may include forming the groove in the second insulating layer in a region between adjacent conductor traces in the dummy trace portion.

In this case, the thickness of the region between the conductor traces is smaller than the thickness of other portions. This sufficiently reduces residual stress in the region between the conductor traces. As a result, the printed circuit board assembly sheet is sufficiently inhibited from being warped.

(9) The step of forming the first insulating layer may include forming the groove in the first insulating layer in a region between adjacent conductor traces in the dummy trace portion.

In this case, the thickness of the region between the conductor traces is smaller than the thickness of other portions. This sufficiently reduces residual stress in the region between the conductor traces. As a result, the printed circuit board assembly sheet is sufficiently inhibited from being warped.

(10) The method of manufacturing the printed circuit board assembly sheet may further include the step of forming an opening in the support substrate in the dummy trace portion. In this case, residual stress is also reduced in the opening of the support substrate in the dummy trace portion. This sufficiently inhibits the printed circuit board assembly sheet from being warped.

Other features, elements, characteristics, and advantages of the present invention will become more apparent from the following description of preferred embodiments of the present invention with reference to the attached drawings.

DETAILED DESCRIPTION OF THE INVENTION

Description will be made of a printed circuit board assembly sheet according to embodiments of the present invention with reference to the drawings. In the present embodiment, a suspension board assembly sheet with circuits (hereinafter referred to as an assembly sheet) is described as one example of the printed circuit board assembly sheet.

(1) Assembly Sheet

Figure 1:
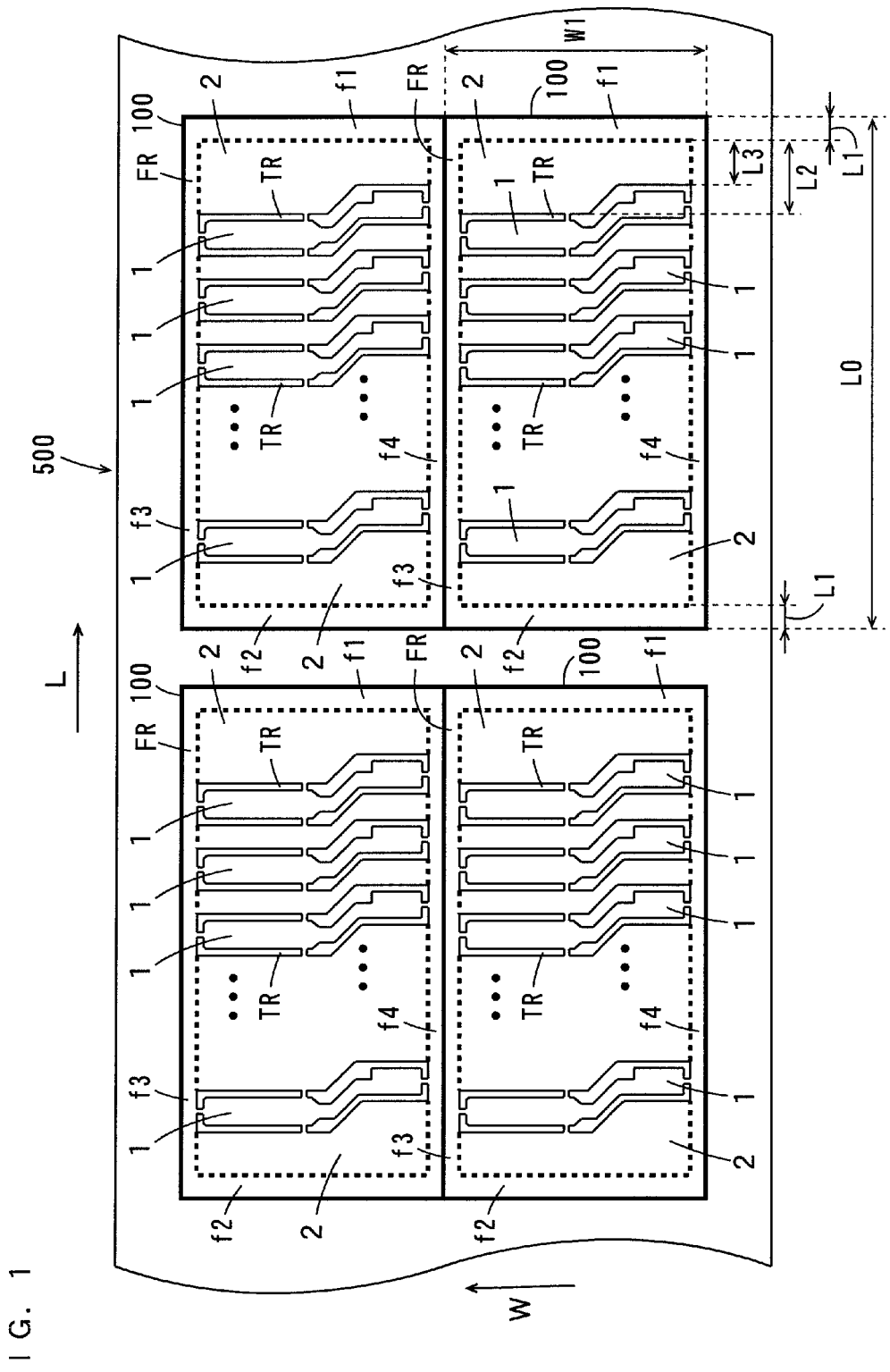
FIG. 1 is a top view of a long-sized base material having a plurality of assembly sheets according to one embodiment of the present invention.
Figure 2:
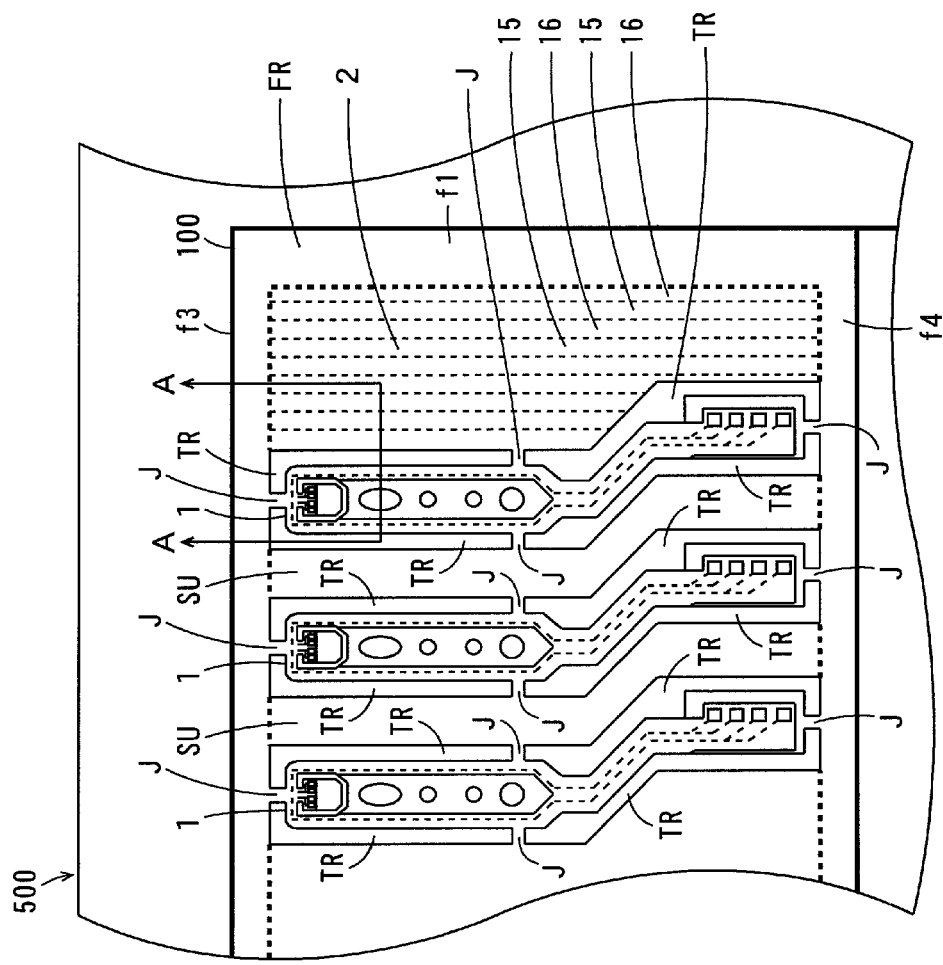
FIG. 2 is an enlarged top view of part of one assembly sheet of FIG. 1.

FIG. 1 is a top view of a long-sized base material having a plurality of assembly sheets according to one embodiment of the present invention. FIG. 2 is an enlarged top view of part of one assembly sheet of FIG. 1. The assembly sheet refers to a half-finished product in the manufacture process of the suspension boards with circuits (hereinafter referred to as suspension boards).

In FIG. 1, a direction parallel to a pair of opposite sides of a long-sized support substrate 500 is referred to as a longitudinal direction L, and a direction perpendicular to the longitudinal direction L is referred to as a width direction W. The long-sized support substrate 500 is formed of a metal support substrate.

A plurality of quadrangular assembly sheets 100 are formed in a plurality of columns along the longitudinal direction L on the long-sized support substrate 500. In the example of FIG. 1, the plurality of assembly sheets 100 are formed in two columns. The plurality of assembly sheets 100 may be formed in three or more columns, or may be formed in a column on the long-sized support substrate 500. A method of manufacturing the assembly sheets 100 will be described below.

Each assembly sheet 100 includes a quadrangular support frame FR, a plurality of long-sized suspension boards 1 and two dummy trace portions 2. The support frame FR is composed of a pair of end frames f1, f2 that are parallel to the width direction W and a pair of side frames f3, f4 that are parallel to the longitudinal direction L. The plurality of suspension boards 1 are formed within the support frame FR. A separation groove TR is formed along the outer peripheral edge of each suspension board 1. The two dummy trace portions 2 are formed in respective portions between suspension boards 1 positioned at both ends and the end frames f1, f2 of the support frame FR. Only one dummy trace portion 2 may be formed within the support frame FR.

As shown in FIG. 2, a plurality of strip-shaped dummy traces 15 extend in the width direction W in the dummy trace portion 2. Grooves 16 are formed between adjacent dummy traces 15.

Support portions SU are formed between adjacent suspension boards 1 within the support frame FR. Both ends of each suspension board 1 are coupled to the support frame FR with coupling portions J. Side portions of each suspension board 1 are coupled to the support portion SU or the dummy trace portion 2 with coupling portions J. In this manner, the plurality of suspension boards 1 are supported in alignment along the longitudinal direction L within the support frame FR.

The coupling portions J are cut in the final stage of the manufacturing steps, so that each suspension board 1 is separated from the support frame FR, the support portion SU and the dummy trace portion 2.

(2) Configurations of the Suspension Board 1 and the Dummy Trace Portion 2

Figure 3:
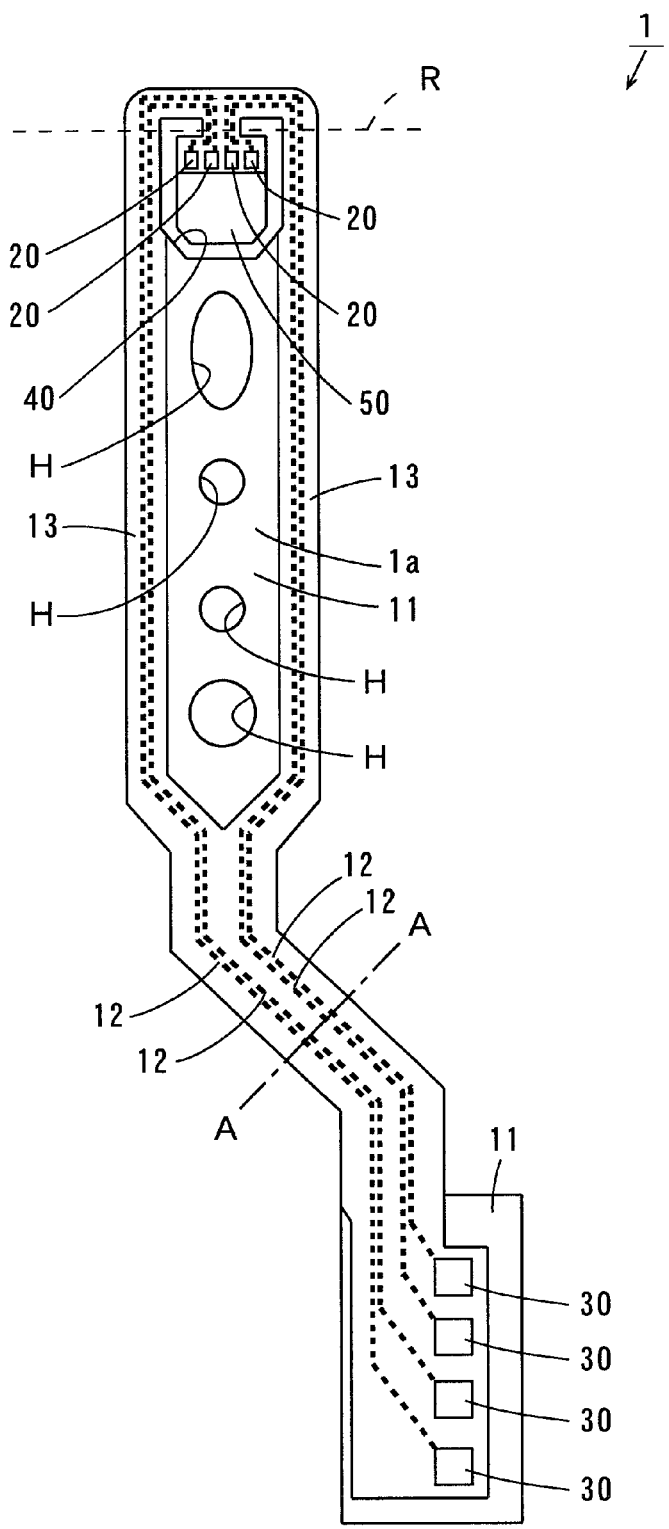
FIG. 3 is a plan view of one suspension board.
Figure 4:
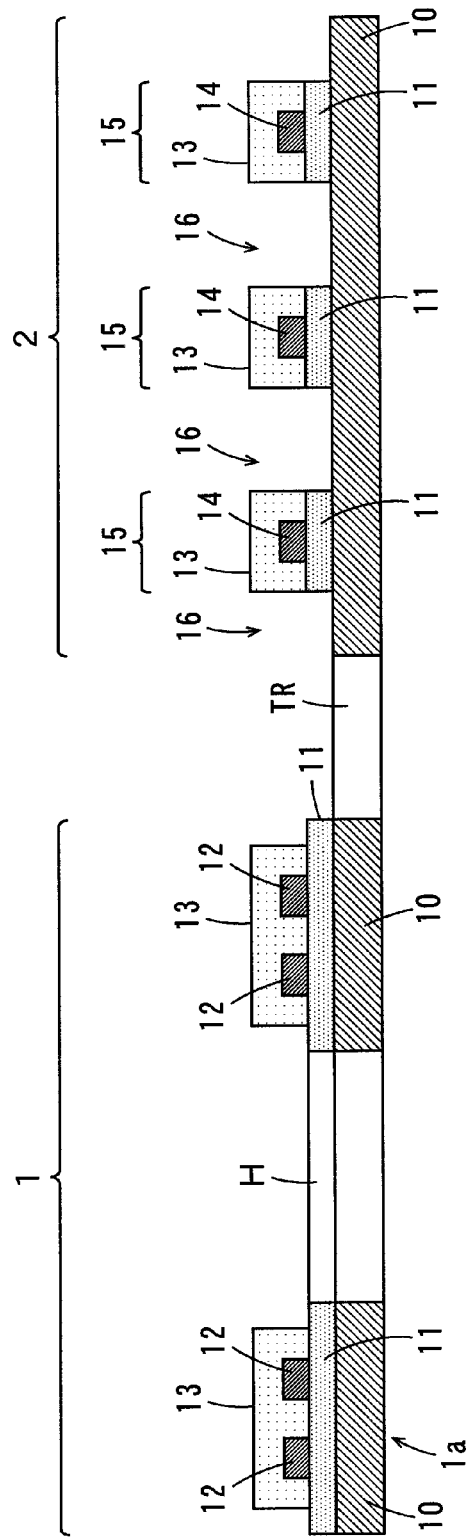
FIG. 4 is a sectional view taken along the line A-A of the assembly sheet of FIG. 2.

FIG. 3 is a plan view of one suspension board. FIG. 4 is a sectional view taken along the line A-A of the assembly sheet 100 of FIG. 2.

As shown in FIG. 3, the suspension board 1 includes a suspension body 1*a* formed of a support substrate 10 (see FIG. 4) and a base insulating layer 11, described below. At the tip of the suspension body 1*a*, a U-shaped opening 40 is formed, thereby providing a magnetic head supporting portion (hereinafter referred to as a tongue) 50. The tongue 50 is bent along the broken line R to form a given angle with respect to the suspension body 1*a*.

Four electrode pads 20 are formed at an end of the tongue 50. Four electrode pads 30 are formed at the other tip of the suspension body 1*a*. The four electrode pads 20 on the tongue 50 and the four electrode pads 30 at the other tip of the suspension body 1*a* are electrically connected to one another through four linear conductor traces 12 that are wiring traces. A plurality of holes H are formed in the suspension body 1*a*. The four conductor traces 12 are covered with a cover insulating layer 13.

FIG. 4 shows cross sections of one suspension board 1 and part of one dummy trace portion 2.

In a region of the suspension board 1, the base insulating layer 11 made of polyimide is formed on the support substrate 10 made of stainless steel. Four conductor traces 12 made of copper are formed on the base insulating layer 11. The cover insulating layer 13 made of polyimide is formed to cover the four conductor traces 12.

In the dummy trace portion 2, the plurality of strip-shaped dummy traces 15 are formed at spacings on the support substrate 10. Each dummy trace 15 includes a strip-shaped base insulating layer 11 made of polyimide, a linear conductor trace 14 made of copper, and a strip-shaped cover insulating layer 13. The strip-shaped base insulating layers 11 are formed at spacings. The conductor trace 14 is formed on each base insulating layer 11, and the cover insulating layer 13 is formed on the base insulating layer 11 to cover the conductor trace 14. Slit-like grooves 16 are formed between adjacent dummy traces 15. The base insulating layer 11 and the cover insulating layer 13 do not exist in the groove 16.

In the present embodiment, the conductor traces 14, the dummy traces 15 and the grooves 16, each of which has a constant width, in the dummy trace portion 2 continuously and linearly extend from the one side frame f3 to the other side frame f4 of the support frame FR of FIG. 2.

The width W1 of the support frame FR of FIG. 1 is 35 mm, for example. Preferably, the width W1 is not less than 5 mm and not more than 50 mm, and more preferably not less than 10 mm and not more than 40 mm. The length L0 of the support frame FR is 90 mm, for example. Preferably, the length L0 is not less than 50 mm and not more than 300 mm, and more preferably not less than 70 mm and not more than 280 mm. The width L1 of each of the end frames f1, f2 is 2.4 mm, for example. Preferably, the width L1 is not less than 1 mm and not more than 10 mm, and more preferably not less than 2 mm and not more than 5 mm.

The largest width L2 of the dummy trace portion 2 is 5 mm, for example. Preferably, the largest width L2 is not less than 3 mm and not more than 10 mm, and more preferably not less than 4 mm and not more than 7 mm. The smallest width L3 of the dummy trace portion 2 is 2 mm, for example. Preferably, the smallest width L3 is not less than 1.0 mm and not more than 4 mm, and more preferably not less than 1.5 mm and not more than 3 mm.

While the plurality of dummy traces 15 and the plurality of grooves 16 are linearly formed parallel to one another in the present embodiment, the present invention is not limited to this. The dummy traces 15 and the grooves 16 may be each formed in a curved shape. Moreover, the dummy traces 15 and the grooves 16 may not be formed parallel to one another.

(3) Method of Manufacturing the Assembly Sheet 100

Figure 5:
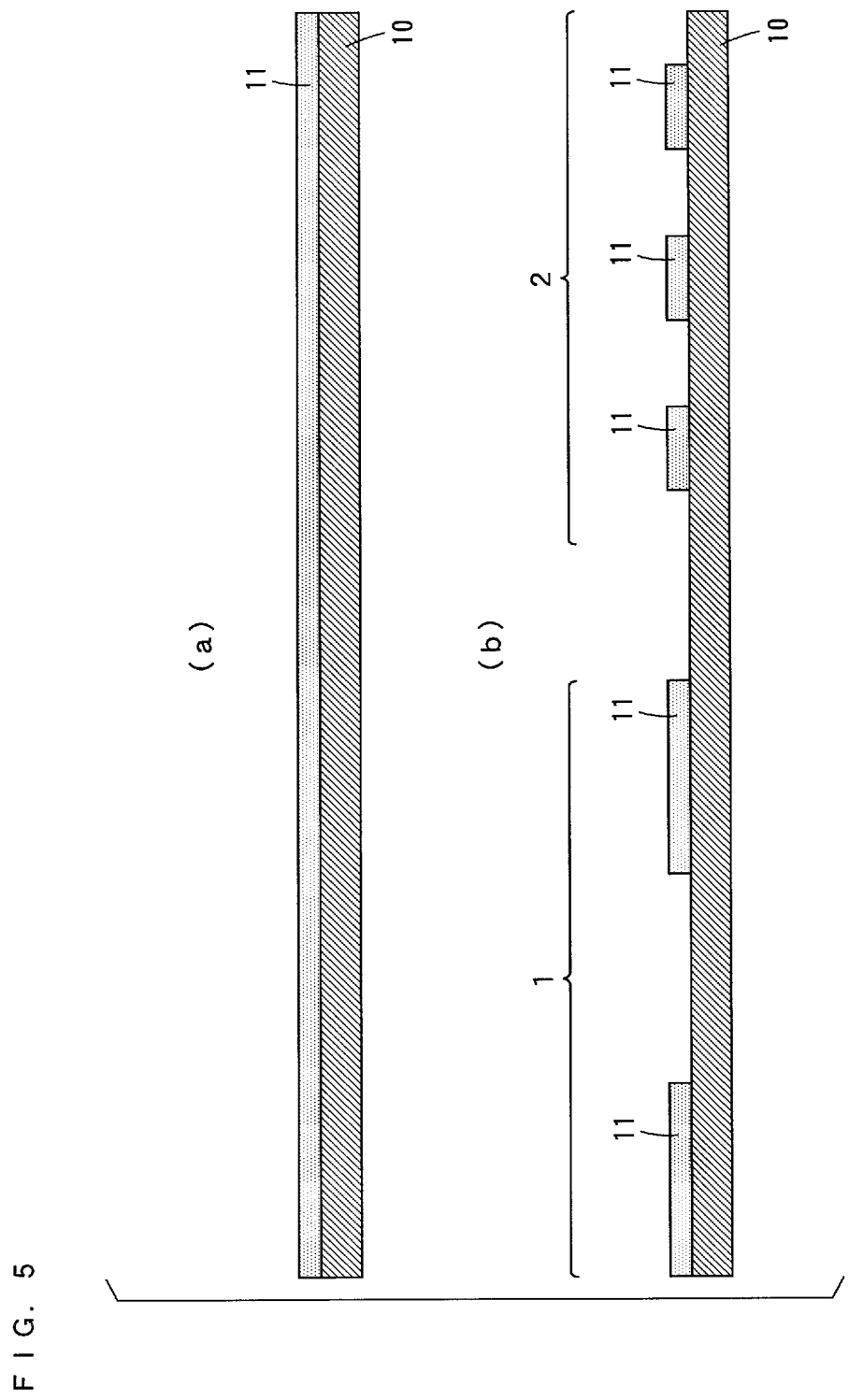
FIGS. 5 (a) and (b) are sectional views for illustrating steps in one example of a method of manufacturing the assembly sheet according to the present embodiment.
Figure 6:
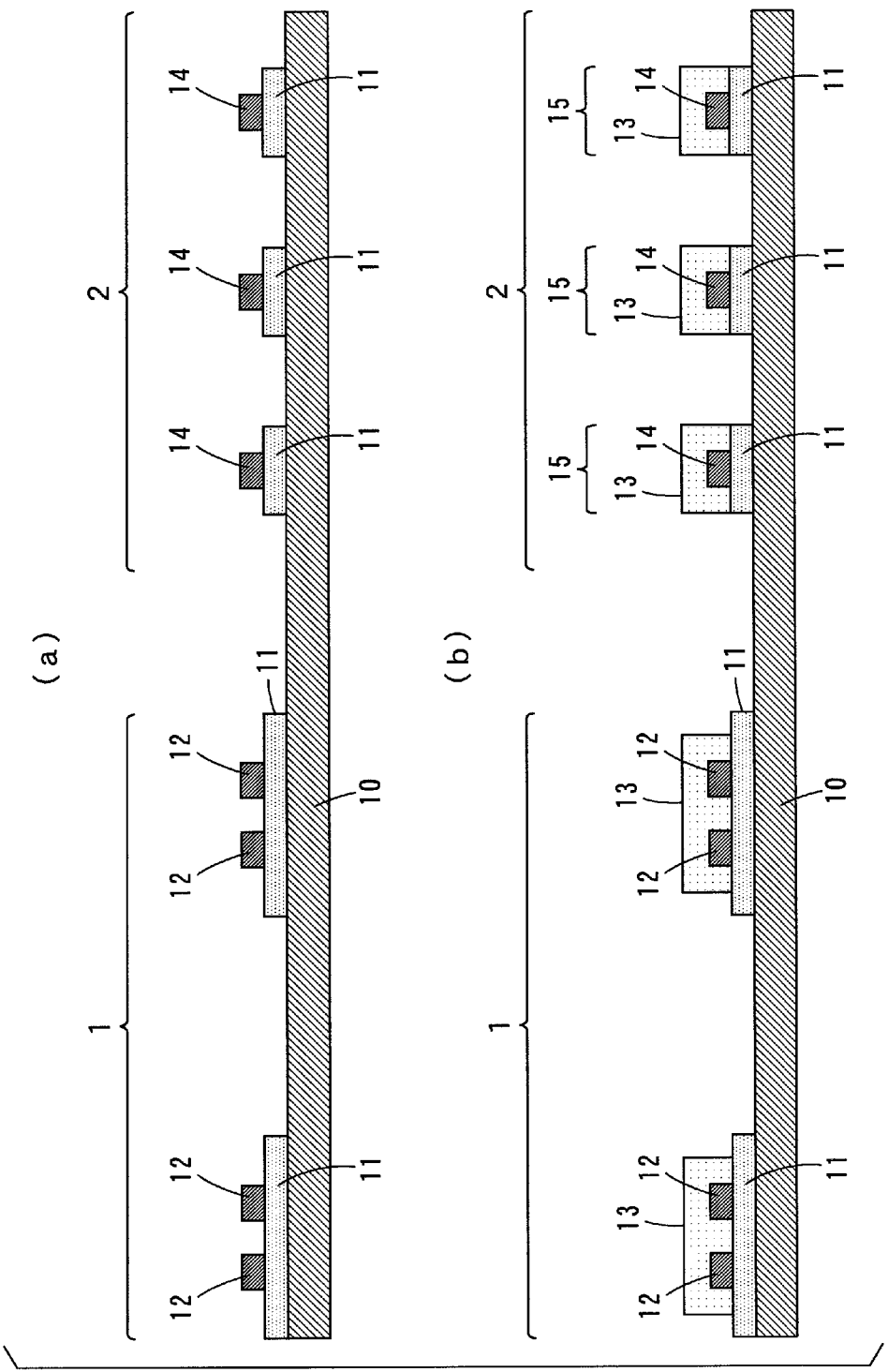
FIGS. 6 (a) and (b) are sectional views for illustrating steps in the one example of the method of manufacturing the assembly sheet according to the present embodiment.

Next, description will be made of the method of manufacturing the assembly sheet 100. FIGS. 5 (*a*), (*b*) and 6 (*a*), (*b*) are sectional views for illustrating steps in one example of the method of manufacturing the assembly sheet 100 according to the present embodiment. FIGS. 5 and 6 correspond to the cross section taken along the line A-A of FIG. 2.

First, the base insulating layer 11 made of polyimide is formed on the long-sized support substrate 10 made of stainless steel as shown in FIG. 5 (*a*). A two-layer base material having a laminated structure of the support substrate 10 and the base insulating layer 11 may be used.

The material for the support substrate 10 is not limited to stainless steel. For example, another metal material such as aluminum (Al) may be used. The thickness of the support substrate 10 is not less than 5 μm and not more than 50 μm, and preferably not less than 10 μm and not more than 30 μm, for example. The material for the base insulating layer 11 is not limited to polyimide. For example, another resin material such as epoxy may be used. The thickness of the base insulating layer 11 is not less than 3 μm and not more than 20 μm, and preferably not less than 5 μm and not more than 15 μm, for example.

The base insulating layer 11 is then subjected to etching with an etching resist (not shown) formed on the base insulating layer 11, thereby forming the base insulating layers 11 for the suspension board 1 and the base insulating layers 11 for the plurality of dummy traces 15 on the support substrate 10 as shown in FIG. 5 (*b*).

Next, the conductor traces 12 made of copper are formed on the base insulating layers 11 for the suspension board 1, and the conductor traces 14 made of copper are formed on the base insulating layers 11 for the plurality of dummy traces 15 by electrolytic plating as shown in FIG. 6 (*a*). The conductor traces 12, 14 may be formed using an additive method, a semi-additive method or another method such as a subtractive method.

The material for the conductor traces 12, 14 is not limited to copper. For example, another metal such as gold (Au) and aluminum or an alloy such as a copper alloy and an aluminum alloy may be used. The thickness of the conductor traces 12 is not less than 3 μm and not more than 16 μm, and preferably not less than 6 μm and not more than 13 μm, for example. The width of the conductor traces 12 is not less than 12 μm and not more than 60 μm, and preferably not less than 16 μm and not more than 50 μm, for example.

The cover insulating layer made of polyimide is formed on the support substrate 10 to cover the conductor traces 12, 14 and the base insulating layers 11, and the cover insulating layer is then subjected to etching with an etching resist (not shown) formed on the cover insulating layer. Thus, the cover insulating layers 13 are formed on the base insulating layers 11 to cover the conductor traces 12 for the suspension board 1, and the cover insulating layers 13 are formed on the base insulating layers 11 to cover the conductor traces 14 for the dummy traces 15 as shown in FIG. 6 (b).

The material for the cover insulating layer 13 is not limited to polyimide. For example, another insulating material such as epoxy may be used. The thickness of the cover insulating layers 13 is not less than 5 μm and not more than 30 μm, and preferably not less than 10 μm and not more than 20 μm, for example.

After that, regions of the support substrate 10 excluding regions of the suspension bodies 1a of FIG. 3, the dummy trace portions 2 and the support portions SU of FIG. 2 are removed by etching, thereby forming the separation grooves TR shown in FIG. 2 and the opening 40 and the holes H shown in FIG. 3.

Then, the long-sized support substrate 500 of FIG. 1 is cut, so that the assembly sheets 100 are separated from one another. Accordingly, the individual assembly sheets 100 are formed. Each of the suspension boards 1 is then cut and separated from the support frame FR at the coupling portions J of the assembly sheet 100. In this manner, the plurality of suspension boards 1 are completed.

Figure 7:
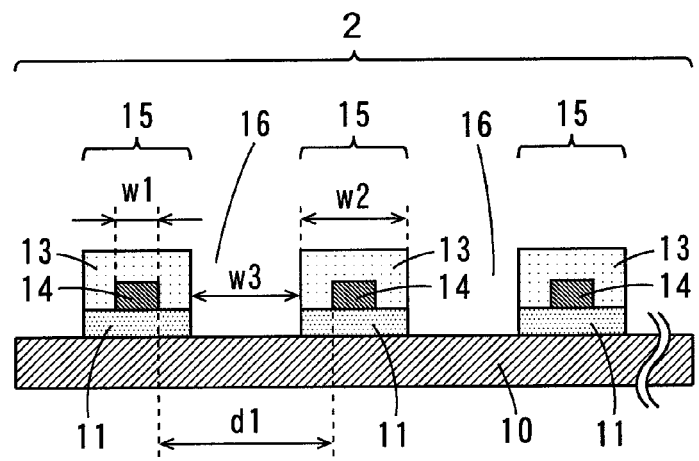
FIG. 7 is a sectional view showing dimensions of a dummy trace portion.

FIG. 7 is a sectional view showing dimensions of the dummy trace portion 2. In the dummy trace portion 2 of FIG. 7, the width w1 of the conductor trace 14 is 50 μm, for example. Preferably, the width w1 is not less than 20 μm and not more than 200 μm, and more preferably not less than 30 μm and not more than 100 μm. The width w2 of the cover insulating layer 13 is 120 μm, for example. Preferably, the width w2 is not less than 50 μm and not more than 300 μm, and more preferably not less than 60 μm and not more than 200 μm. The width w2 of the cover insulating layer 13 is equal to the width of the dummy trace 15.

The width w3 of the groove 16 is 320 μm, for example. Preferably, the width w3 is not less than 30 μm and not more than 1900 μm, and more preferably not less than 100 μm and not more than 700 μm. A distance d1 between adjacent conductor traces 14 is 250 μm, for example. Preferably, the distance d1 is not less than 100 μm and not more than 2000 μm, and more preferably not less than 200 μm and not more than 800 μm.

(4) Effects of the Embodiment

In the assembly sheet 100 according to the present embodiment, the grooves 16 are formed in the base insulating layer 11 and the cover insulating layer 13 in the dummy trace portion 2. This reduces residual stress in the base insulating layer 11 and the cover insulating layer 13 in the dummy trace portion 2. As a result, the assembly sheet 100 is inhibited from being warped.

(5) Other Examples of the Configuration of the Dummy Trace Portion

FIGS. 8 to 12 are sectional views showing other examples of the configuration of the dummy trace portion 2. Dummy trace portions in FIGS. 8 to 12 will be described by mainly referring to differences from the dummy trace portion 2 of FIG. 7.

Figure 8:
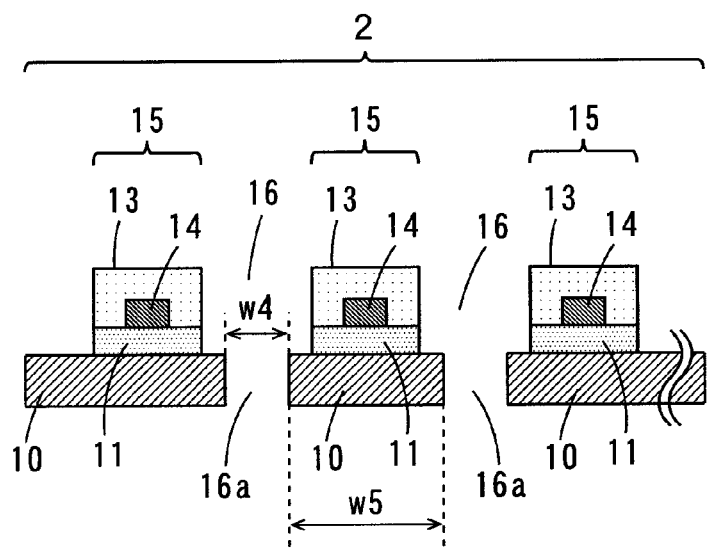
FIG. 8 is a sectional view showing another example of the configuration of the dummy trace portion.

In the dummy trace portion 2 of FIG. 8, a slit-like opening 16a is formed in a region of the support substrate 10 inside each groove 16. The width w4 of the openings 16a is 70 μm, for example. Preferably, the width w4 is not less than 20 μm and not more than 250 μm, and more preferably not less than 50 μm and not more than 180 μm. The width w5 of the support substrate 10 between the openings 16a is 230 μm, for example. Preferably, the width w5 is not less than 50 μm and not more than 2000 μm, and more preferably not less than 110 μm and not more than 750 μm.

In this example, the residual stress in the base insulating layer 11 and the cover insulating layer 13 in the dummy trace portion 2 is reduced, and the residual stress in the support substrate 10 is reduced. As a result, the assembly sheet 100 is sufficiently inhibited from being warped.

Figure 9:
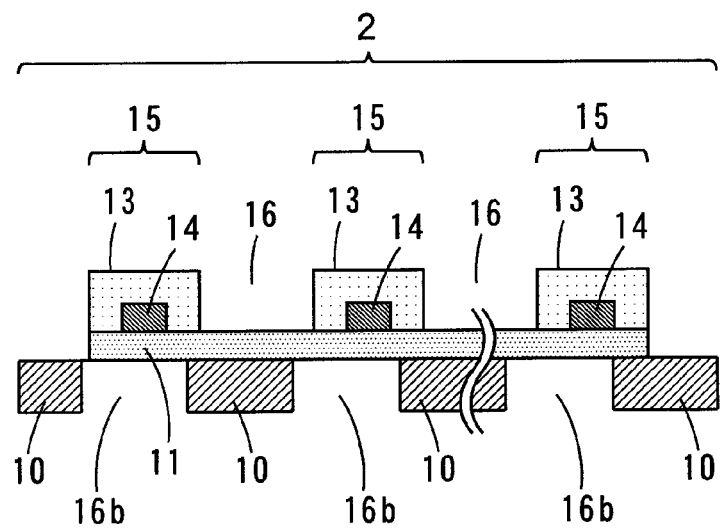
FIG. 9 is a sectional view showing another example of the configuration of the dummy trace portion.

In the dummy trace portion 2 of FIG. 9, the cover insulating layer 13 has the grooves 16, and the base insulating layer 11 does not have the grooves 16. A plurality of slit-like openings 16b are formed in the support substrate 10. The plurality of slit-like openings 16b may not be formed in regions corresponding to the plurality of grooves 16. In the example of FIG. 9, the plurality of slit-like openings 16b are formed to overlap the dummy traces 15, respectively.

In this example, the residual stress in the cover insulating layer 13 in the dummy trace portion 2 is reduced, and the residual stress in the support substrate 10 is reduced. As a result, the assembly sheet 100 is inhibited from being warped.

Figure 10:
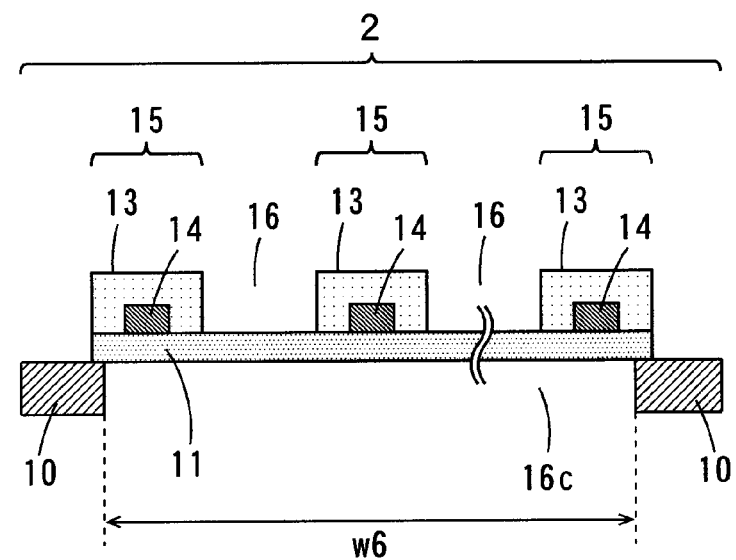
FIG. 10 is a sectional view showing another example of the configuration of the dummy trace portion.

In the dummy trace portion 2 of FIG. 10, similarly to the dummy trace portion 2 of FIG. 9, the cover insulating layer 13 has the grooves 16, and the base insulating layer 11 does not have the grooves 16. An opening 16c is formed in the support substrate 10 to overlap a region including the plurality of dummy traces 15 and the plurality of grooves 16.

The width w6 of the opening 16c is 1500 μm, for example. Preferably, the width w6 is not less than 500 μm and not more than 3000 μm, and more preferably not less than 1000 μm and not more than 2000 μm.

In this example, the residual stress in the cover insulating layer 13 in the dummy trace portion 2 is reduced, and the residual stress in the support substrate 10 is reduced. As a result, the assembly sheet 100 is inhibited from being warped.

Figure 11:
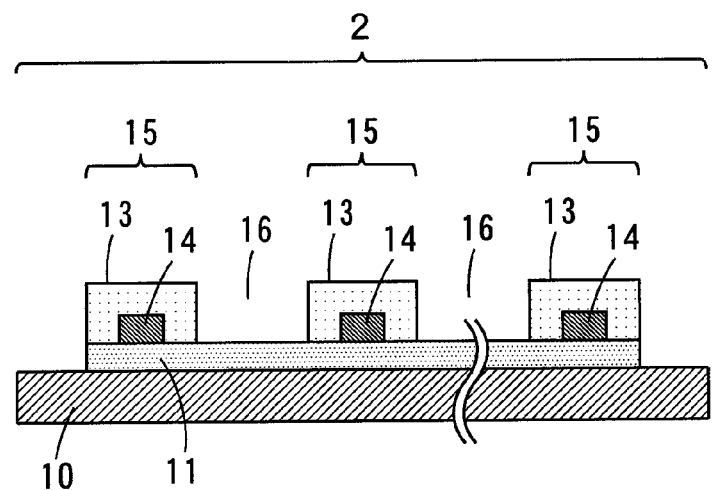
FIG. 11 is a sectional view showing another example of the configuration of the dummy trace portion.

In the dummy trace portion 2 of FIG. 11, similarly to the dummy trace portion 2 of FIGS. 9 and 10, the cover insulating layer 13 has the grooves 16, and the base insulating layer 11 does not have the grooves 16. An opening is not formed in the support substrate 10.

In this example, the residual stress is reduced in the cover insulating layer 13 in the dummy trace portion 2. As a result, the assembly sheet 100 is inhibited from being warped.

Figure 12:
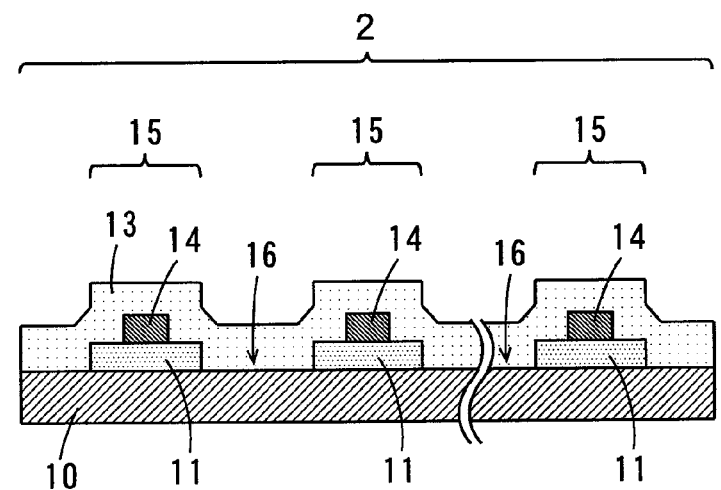
FIG. 12 is a sectional view showing another example of the configuration of the dummy trace portion.

In the dummy trace portion 2 of FIG. 12, the base insulating layer 11 has the grooves 16, and the cover insulating layer 13 does not have the grooves 16.

In this example, the residual stress is reduced in the base insulating layer 11 in the dummy trace portion 2. As a result, the assembly sheet 100 is inhibited from being warped.

(6) Inventive Example

In an inventive example described below, the assembly sheet 100 shown in FIGS. 1 to 7 was formed, and an amount of warp occurred in the assembly sheet 100 was measured. In a comparative example, the assembly sheet having a dummy trace portion 2a shown in FIG. 13 was formed, and an amount of warp occurred in the assembly sheet was measured.

In the assembly sheet 100 of the inventive example, the support substrate 10 was made of stainless steel, the base insulating layer 11 and the cover insulating layer 13 were made of polyimide, and the conductor traces 12, 14 were made of copper.

The assembly sheet 100 of the inventive example has the width W1 (see FIG. 1) of 35 mm, and the length L0 of 90 mm. The width L1 of each of the end frames f1, f2 of the support frame FR was 2.4 mm, the largest width L2 of the dummy trace portion 2 was 5.5 mm, and the smallest width L3 of the dummy trace portion 2 was 2.5 mm.

The width of the conductor traces 12 of the suspension board 1 was 20 μm, the width w1 of the conductor traces 14 in the dummy trace portion 2 was 50 μm, the width w2 of each of the base insulating layers 11 and the cover insulating layers 13 was 120 μm, the width w3 of the grooves 16 was 320 μm, and the distance d1 between adjacent conductor traces 14 was 250 μm.

The thickness of the support substrate 10 was 18 μm, the thickness of the base insulating layers 11 was 10 μm, the thickness of each of the conductor traces 12, 14 was 12 μm, and the thickness of the cover insulating layers was 4 μm.

Figure 13:
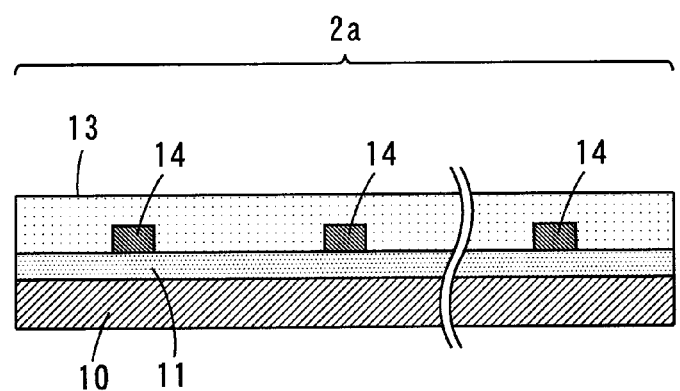
FIG. 13 is a schematic sectional view of a dummy trace portion of an assembly sheet of a comparative example.

FIG. 13 is a schematic sectional view of the dummy trace portion of the assembly sheet of the comparative example. As shown in FIG. 13, the base insulating layer 11 was formed on the support substrate 10 in the dummy trace portion 2a, and the conductor traces 14 were formed on the base insulating layer 11. The cover insulating layer 13 was formed on the base insulating layer 11 to cover the plurality of conductor traces 14. The base insulating layer 11 and the cover insulating layer 13 do not have the grooves 16.

The respective materials and dimensions of the parts of the assembly sheet of the comparative example were the same as those of the parts of the assembly sheet 100 of the inventive example.

Figure 14:
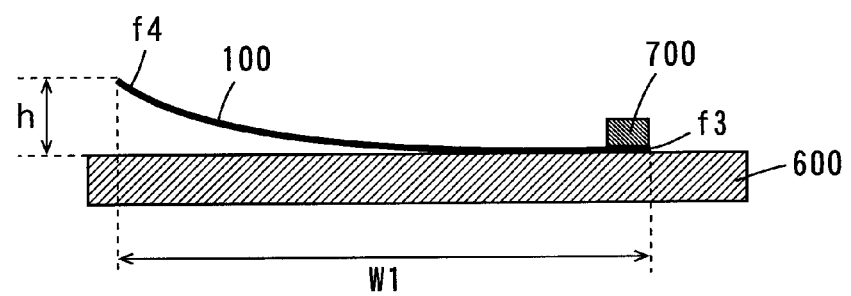
FIG. 14 is a schematic diagram for illustrating a method of measuring an amount of warp of the assembly sheet.

FIG. 14 is a schematic diagram for illustrating a method of measuring an amount of warp of the assembly sheet. As shown in FIG. 14, the assembly sheet 100 was placed on a support stage 600 having a horizontal upper surface, and the one side frame f3 of the support frame FR was fixed to the upper surface of the support stage 600 by a fixing member 700. In this state, the height from the upper surface of the support stage 600 to an end edge of the other side frame f4 of the assembly sheet 100 was measured as the amount of warp h. The amount of warp h of the assembly sheet of the comparative example was measured in the same manner.

Respective amounts of warp h of six test samples were measured for the assembly sheet 100 of the inventive example, and the average of the amounts of warp h of the six test samples was calculated. Similarly, respective amounts of warp h of six test samples were measured for the assembly sheet of the comparative example, and the average of the amounts of warp h of the six test samples was calculated. Results of the measurements are shown in Table 1.

TABLE 1

| TEST SAMPLE | AMOUNT OF WARP h [mm] | |
| --- | --- | --- |
| | INVENTIVE EXAMPLE | COMPARATIVE EXAMPLE |
| 1 | 0.4 | 1.1 |
| 2 | 0.5 | 1.2 |
| 3 | 0.5 | 1.0 |
| 4 | 0.6 | 1.2 |
| 5 | 0.4 | 1.1 |
| 6 | 0.4 | 1.1 |
| AVERAGE | 0.47 | 1.12 |

As shown in Table 1, the average of the amounts of warp h of the assembly sheet 100 of the inventive example was 0.47 mm, and the average of the amounts of warp h of the assembly sheet of the comparative example was 1.12 mm. As seen from the above, the amount of warp h of the assembly sheet 100 of the inventive example was as low as 42% of the amount of warp h of the assembly sheet of the comparative example.

It can be seen from the result that the amount of warp in the assembly sheet 100 is reduced by forming the grooves 16 in the dummy trace portion 2 of the assembly sheet 100.

(7) Other Embodiments

While the grooves 16 in the dummy trace portion 2 penetrate the cover insulating layer 13 from the upper surface to the lower surface of the cover insulating layer 13 or penetrate the base insulating layer 11 from the upper surface to the lower surface of the base insulating layer 11 in the foregoing embodiment, the present invention is not limited to this. The grooves 16 in the dummy trace portion 2 may be formed in the cover insulating layer 13 so as to have a given depth from the upper surface of the cover insulating layer 13, or may be formed in the base insulating layer 11 so as to have a given depth from the upper surface of the base insulating layer 11.

While the grooves 16 in the dummy trace portion 2 continuously extend from the one side frame f3 to the other side frame f4 of the support frame FR in the foregoing embodiment, the present invention is not limited to this. The grooves 16 in the dummy trace portion 2 may be interrupted within the support frame FR.

While the slit-like openings 16a, 16b, 16c continuously extend from the one side frame f3 to the other side frame f4 of the support frame FR in the support substrate 10 in the dummy trace portion 2 in the examples of FIGS. 8, 9 and 10, the present invention is not limited to this. The openings 16a, 16b, 16c may be interrupted within the support frame FR in the support substrate 10 in the dummy trace portion 2.

While each of the conductor traces 14 in the dummy trace portion 2 has a constant width in the foregoing embodiment, the present invention is not limited to this. Each of the conductor traces 14 in the dummy trace portion 2 may have different widths in different portions in its longitudinal direction.

While each of the grooves 16 in the dummy trace portion 2 has a constant width in the foregoing embodiment, the present invention is not limited to this. Each of the grooves 16 in the dummy trace portion 2 may have different widths in different portions in its longitudinal direction.

While each of the openings 16a, 16b, 16c of the support substrate 10 in the dummy trace portion 2 has a constant width in the examples of FIGS. 8, 9 and 10, the present invention is not limited to this. Each of the openings 16a, 16b, 16c of the support substrate 10 in the dummy trace portion 2 may have different widths in different portions in its longitudinal direction.

While the assembly sheet 100 has the quadrangular shape in the foregoing embodiment, the present invention is not limited to this. For example, the assembly sheet 100 may have another shape such as an elliptical shape or a triangular shape.

While the dummy trace portion 2 has a substantially trapezoidal shape in the foregoing embodiment, the present invention is not limited to this. The shape of the dummy trace portion 2 varies according to the shape of the printed circuit board. The dummy trace portion 2 may have a rectangular shape or a triangular shape, for example.

While the grooves 16 in the dummy trace portion 2 are not formed in the support frame FR in the foregoing embodiment, the grooves 16 may be formed in the support frame FR.

While the printed circuit board assembly sheet is the suspension board assembly sheet with circuit in the foregoing embodiment, the printed circuit boards of the printed circuit board assembly sheet according to the present invention is not limited to the suspension boards with circuits. For example, the printed circuit boards may be other printed circuit boards such as flexible printed circuit boards, substrates for COF (Chip On Film) and substrates for TAB (Tape Automated Bonding).

(8) Correspondences between Elements in the Claims and Parts in Embodiments

In the following paragraphs, non-limiting examples of correspondences between various elements recited in the claims below and those described above with respect to various preferred embodiments of the present invention are explained.

In the above-described embodiments, the assembly sheet 100 is an example of a printed circuit board assembly sheet, the suspension board with circuit 1 is an example of a printed circuit board, the support frame FR is an example of a support frame, the dummy trace portion 2 is an example of a dummy trace portion, and the groove 16 is an example of a separation groove.

The support substrate 10 is an example of a support substrate, the base insulating layer 11 is an example of a first insulating layer, the conductor traces 12, 14 are examples of a conductor trace, and the cover insulating layer 13 is an example of a second insulating layer.

The openings 16a, 16b, 16c are examples of an opening, the side frames f3, f4 are an example of a pair of first frames, and the end frames f1, f2 are an example of a pair of second frames.

As each of various elements recited in the claims, various other elements having configurations or functions described in the claims can be also used.

While preferred embodiments of the present invention have been described above, it is to be understood that variations and modifications will be apparent to those skilled in the art without departing the scope and spirit of the present invention. The scope of the present invention, therefore, is to be determined solely by the following claims.

We claim:

1. A method of manufacturing a printed circuit board assembly sheet comprising a plurality of printed circuit boards, a support frame configured to integrally support the plurality of printed circuit boards such that the plurality of printed circuit boards are arranged at spacings, and a dummy trace portion provided in a region between at least one printed circuit board on one end side and the support frame, the method comprising the steps of:

forming first insulating layers, which correspond to the plurality of printed circuit boards and the dummy trace portion, on a support substrate;

forming a plurality of conductor traces on each of the first insulating layers corresponding to the plurality of printed circuit boards and the first insulating layer corresponding to the dummy trace portion; and forming second insulating layers on the first insulating layers to cover the plurality of conductor traces corresponding to the plurality of printed circuit boards and the conductor trace corresponding to the dummy trace portion, respectively, wherein each of the plurality of printed circuit boards is configured to be separated from the support frame, and the dummy trace portion is configured not to be separated from the support frame, wherein a groove is not formed in the first insulating layer in a region between adjacent conductor traces in the dummy trace portion, and wherein the step of forming the second insulating layers includes forming a groove in the second insulating layer in the region between the adjacent conductor traces in the dummy trace portion.

2. The method of manufacturing the printed circuit board assembly sheet according to claim 1, further comprising the step of forming an opening in the support substrate in the dummy trace portion.

3. The method of manufacturing the printed circuit board assembly sheet according to claim 1, wherein the support frame has a pair of first frame portions that are substantially parallel to each other and a pair of second frame portions that are substantially perpendicular to the first frame portions, the plurality of printed circuit boards being provided to be arranged in a direction parallel to the pair of first frame portions, and wherein the dummy trace portion is provided in the region between at least the printed circuit board on the one end side and one of the pair of second frame portions, the conductor traces and the groove in the dummy trace portion being formed to extend in a direction from one of the first frame portions to the other one of the first frame portions.

4. The method of manufacturing the printed circuit board assembly sheet according to claim 1, wherein the printed circuit board is a suspension board with circuits.

5. A method of manufacturing a printed circuit board assembly sheet comprising a plurality of printed circuit boards, a support frame configured to integrally support the plurality of printed circuit boards such that the plurality of printed circuit boards are arranged at spacings, and a dummy trace portion provided in a region between at least a printed circuit board on one end side and the support frame, the method comprising the steps of:

forming first insulating layers, which correspond to the plurality of printed circuit boards and the dummy trace portion, on a support substrate;

forming a plurality of conductor traces on each of the first insulating layers corresponding to the plurality of printed circuit boards and the first insulating layer corresponding to the dummy trace portion; and forming second insulating layers on the first insulating layers to cover the plurality of conductor traces corresponding to the plurality of printed circuit boards and the conductor trace corresponding to the dummy trace portion, respectively, wherein each of the plurality of printed circuit boards is configured to be separated from the support frame, and the dummy trace portion is configured not to be separated from the support frame, wherein the step of forming the first insulating layers includes forming a groove in the first insulating layer in a region between adjacent conductor traces in the dummy trace portion, and wherein, after the printed circuit board assembly sheet has been formed, the groove is not formed in the second insulating layer in the region between the adjacent conductor traces in the dummy trace portion.

6. The method of manufacturing the printed circuit board assembly sheet according to claim 5, further comprising the step of forming an opening in the support substrate in the dummy trace portion.

7. The method of manufacturing the printed circuit board assembly sheet according to claim 5, wherein the printed circuit board is a suspension board with circuits.

8. A method of manufacturing a printed circuit board assembly sheet comprising a plurality of printed circuit boards, a support frame configured to integrally support the plurality of printed circuit boards such that the plurality of printed circuit boards are arranged at spacings, and a dummy trace portion provided in a region between at least a printed circuit board on one end side and the support frame, the method comprising the steps of:

forming first insulating layers, which correspond to the plurality of printed circuit boards and the dummy trace portion, on a support substrate;

forming a plurality of conductor traces on each of the first insulating layers corresponding to the plurality of printed circuit boards and the first insulating layer corresponding to the dummy trace portion; and forming second insulating layers on the first insulating layers to cover the plurality of conductor traces corresponding to the plurality of printed circuit boards and the conductor trace corresponding to the dummy trace portion, respectively, wherein each of the plurality of printed circuit boards is configured to be separated from the support frame, and the dummy trace portion is configured not to be separated from the support frame, wherein the step of forming the first insulating layers includes forming a groove in the first insulating layer in a region between adjacent conductor traces in the dummy trace portion, and wherein the step of forming the second insulating layers includes forming the groove in the second insulating layer in the region between the adjacent conductor traces in the dummy trace portion.

9. The method of manufacturing the printed circuit board assembly sheet according to claim 8, further comprising the step of forming an opening in the support substrate in the dummy trace portion.

10. The method of manufacturing the printed circuit board assembly sheet according to claim 8, wherein the support frame has a pair of first frame portions that are substantially parallel to each other, and a pair of second frame portions that are substantially perpendicular to the first frame portions, and the plurality of printed circuit boards are provided to be arranged in a direction parallel to the pair of first frame portions, and the dummy trace portion is provided in the region between at least the printed circuit board on the one end side and one of the pair of second frame portions, and the conductor traces and the groove in the dummy trace portion are formed to extend in a direction from one of the first frame portions to the other one of the first frame portions.

11. The method of manufacturing the printed circuit board assembly sheet according to claim 8, wherein the printed circuit board is a suspension board with circuits.

12. A method of manufacturing a printed circuit board assembly sheet comprising a plurality of printed circuit boards, a support frame configured to integrally support the plurality of printed circuit boards such that the plurality of printed circuit boards are arranged at spacings, and a dummy trace portion provided in a region between at least a printed circuit board on one end side and the support frame, the method comprising the steps of:

forming first insulating layers, which correspond to the plurality of printed circuit boards and the dummy trace portion, on a support substrate;

forming a plurality of conductor traces on each of the first insulating layers corresponding to the plurality of printed circuit boards and the first insulating layer corresponding to the dummy trace portion; and forming second insulating layers on the first insulating layers to cover the plurality of conductor traces corresponding to the plurality of printed circuit boards and the conductor trace corresponding to the dummy trace portion, respectively, wherein each of the plurality of printed circuit boards is configured to be separated from the support frame, and the dummy trace portion is configured not to be separated from the support frame, wherein the step of forming the first insulating layers includes forming a groove in the first insulating layer in a region between adjacent conductor traces in the dummy trace portion, and wherein the groove is not formed in the second insulating layer in the region between the adjacent conductor traces in the dummy trace portion, wherein the support frame has a pair of first frame portions that are substantially parallel to each other, and a pair of second frame portions that are substantially perpendicular to the first frame portions, and the plurality of printed circuit boards are provided to be arranged in a direction parallel to the pair of first frame portions, and wherein the dummy trace portion is provided in the region between at least the printed circuit board on the one end side and one of the pair of second frame portions, and the conductor traces and the groove in the dummy trace portion are formed to extend in a direction from one of the first frame portions to the other one of the first frame portions.

\* \* \* \* \*